(12) United States Patent
Cotton

(10) Patent No.: US 6,713,685 B1
(45) Date of Patent: Mar. 30, 2004

(54) NON-CIRCULAR MICRO-VIA (75) Inventor: Martin A. Cotton, South Shields (GB)

(73) Assignee: Viasystems Group, Inc., St. Louis, MO (US)

( * ) Notice: Subject to any disclaimer, the term of this patent is extended or adjusted under 35 U.S.C. 154(b) by 0 days.

(21) Appl. No.: 09/786,787

(22) PCT Filed: Sep. 7, 1999

(86) PCT No.: PCT/US99/20418
§ 371 (c)(1),
(2), (4) Date: May 10, 2001

(87) PCT Pub. No.: WO00/16443
PCT Pub. Date: Mar. 23, 2000

Related U.S. Application Data (60) Provisional application No. 60/099,730, filed on Sep. 10, 1998.

(51) Int. Cl.⁷ .............................. H01R 12/04; H05K 1/11
(52) U.S. Cl. ..................... 174/262; 174/265; 174/266
(58) Field of Search .................................. 174/262, 260, 174/261, 264, 265, 35 R, 255; 361/800

(56) References Cited

U.S. PATENT DOCUMENTS

| | | | | |
|---|---|---|---|---|
| 5,270,493 A | * | 12/1993 | Inoue et al. ................. | 174/253 |
| 5,590,460 A | * | 1/1997 | DiStefano et al. ............ | 29/830 |
| 5,966,294 A | * | 10/1999 | Harada et al. ............... | 361/794 |
| 6,000,120 A | | 12/1999 | Arledge et al. .............. | 29/600 |
| 6,247,228 B1 | * | 6/2001 | Distefano et al. ............. | 29/830 |
| 6,388,208 B1 | * | 5/2002 | Kiani et al. .................. | 174/266 |

* cited by examiner

Primary Examiner—Kamand Cuneo
Assistant Examiner—Tuan Dinh
(74) Attorney, Agent, or Firm—Dunlap, Codding & Rogers, P.C.

(57) ABSTRACT

Non-circular vias and methods of cutting away material in a printed circuit board (PCB) so as to form non-circular vias. Laser ablation or plasma ablation is used to remove PCB material about a centerline. This type of material removal allows lateral movement to effect non-circular patterns. Exemplary shapes are convoluted circle vias, square vias, extended/elongated vias, and trench vias. The trench vias may be micro milled to form a coaxialised structure that provides noise suppression and EMI protection, and are elongated to be even greater than three times the diameter of a circular micro-via.

5 Claims, 5 Drawing Sheets

NON-CIRCULAR MICRO-VIA

This application claims the benefit of Ser. No. 60/099,730, filed Sep. 10, 1998.

TECHNICAL FIELD

This invention relates to Printed Circuit Boards (PCBs) and particularly to micro-via plated through hole interconnect and shielding structures for PCBs and the method for creating such micro-vias and shielding structures.

BACKGROUND ART

It is always the goal in PCB design to increase the functionality and component capacity. Almost since the inception of PCB's, engineers have striven to add more and more functionality and hence more interconnect traces. These traces go from side to side and from layer to layer and in this way form the interconnect between the "active" electronic elements. The PCB has throughout its lifetime been made from many alternate materials and processes. The most common material being a glass epoxy based laminate, with the PCB builds being of a single sided, double sided or a multilayered (more than 2 layers) configuration. The interconnect medium between layers are created by drilling with mechanical drill through the layers of the PCB exposing the copper interconnect lands on the individual layers. The PCB is then passed through a plating solution and the various layers are connected by plated or deposited copper formed on the interior surface of the drilled through hole. This drilled plated barrel of inter layer interconnect is called a "via". The most obvious physical attribute is that the via is round when viewed from the top or bottom side. This is caused by "drilling". Drilling holes through laminate causes a round or circular hole to be created. Drilling of holes is carried out on a drilling machine that drills using a "drill", a mechanical device that rotates or cuts around its centerline cutting away material about the centerline to create the round or circular holes. The action of a drill is one of cutting.

As mentioned previously more and more interconnect traces have been required as circuit and hence PCB complexity increased. This of course has led to a decrease in size of the vias and an increase in their number. The new smaller vias are called "micro vias" and are typically of a blind nature. Blind vias are vias that do not pass completely through the PCB, but stop at some predetermined layer depth. The smaller via size is required due to an increase in trace density which reduces the points on a given layer where a terminal interconnect land can be positioned such that it aligns with a land on another layer without interference with traces there between. If cross-sectional real estate that a via occupies is reduced, the ability to utilize a via is more likely. However, the decrease in via size has meant that the mechanical drilling of micro vias is almost commercially extinct. Several alternate processes have sprung up namely laser ablation and plasma ablation. Material ablation is an electrochemical reaction to either laser light pulsing or the plasma process. It is not a cutting action or process. However, ablation in like manner removes away material around a centerline.

Ablation emulates mechanical drilling by creating a basically circular hole whichever method is used. This ablated round hole is often described as "drilling" because of removal of material about a centerline, hence the term, Micro via drilling. This round hole has performance level based around the creation of a round or circular shape hole, namely, current carrying capacity, resistance and inductance. For example, a blind via has a lower inductance than a through hole because it has shorter length to the barrel of the via, but its current carrying capacity does not alter because the diameter and hence the circumference of the hole remains the same. Therefore, the current carrying capacity of a via is dependent on the circumferencial length and the conducting medium thickness at the point of interconnection between the trace land and the via.

There are several problems with the conventional circular profile micro-via. For example, when densely populated multi-layer PCBs are utilized there are an enormous amount of traces and interconnects. Circular vias may be a limiting feature if the via is to avoid traces or components when extending through multiple layers because of the cutting area required for a circular hole. Also, the current carrying capacity of circular vias are limited because current carrying capacity of a via is a factor of circumference and thickness of the plating applied to the inner wall. This factor also effects the ability to have multiple traces on a single layer to connect up to the same via because the distance between the contact points are too short thus exceeding the current carrying capacity of the via at those points or the interconnect density at a given land or PCB layer. Conventional standard circular profile micro vias also have a characteristic inductance property due to the spiral nature of the circular via which effects the electron flow through the via resulting in an inductance. The inductance characteristic tends to slow down signal speed and increase noise susceptibility.

Through holes that can possibly be categorized as a Micro-via have been utilized on non-organic silicone based semi-conductor devices to connect two conductive layers separated by an insulation layer where the insulation layer has a contact through hole which exposes a portion of the two conductive surfaces. This through hole embodiment is where one conductive layer continuously extends down through the through-hole thereby electrically connecting the two layers. The semi-conductor via technology has a different purpose and hence a different structure, however it is worth mentioning when discussing via technology (electrical interconnection utilizing a through hole) for completeness. With a semiconductor via the first conductive layer actually conforms to the walls of the through hole and continues over the exposed area of the second layer and in continuous contact with said second layer forming what may be described as a blind via. However the process of forming the via is different from a process where material is cut away about a centerline and there is no plating structure.

In this semi-conductor example the through-hole is filled with a continuation of a first conductive layer of the semi-conductor into the through hole. The through hole structure utilized for semiconductor designs differs from through holes or micro vias utilized for printed circuit boards. First, micro vias for printed circuit boards interconnect a plurality of circuit trace terminal lands or pads by transcending through and exposing them to an interior conductive plating, whereas the semiconductor through hole structure is that of a hole through an insulation layer that separates two layers of conductive media. The interconnection is established by continuously extending one conductive media layer through the through hole establishing contact with the second layer. Establishing a plurality of interconnections to a node created by a via is not the objective in the semiconductor environment as it is with printed circuit board vias.

The specific issue with regard to semi conductor vias is electrical failure of the via structure due to thermal and other stresses particularly in the area around the rim of the opening of the through hole. This is where the conductive media layer begins to extend through the through hole and failures occur because it is at this point that the media layer tends to be thinner. The problem is concentration of stresses in a small area. Whereas, with printed circuit boards the issue with vias is the density of the interconnections as it relates to current carrying capacity and better voltage drop.

DISCLOSURE OF THE INVENTION

It is in view of the above problems that the present invention was developed.

The invention thus has as an object to provide additional current carrying capacity for a via and reduce its inductance characteristic. It is also object of this invention to provide vias that can physically avoid traces and components for densely populated multiple trace multi-layer boards. It is also an object of this invention to connect traces on two or more layers that are not vertically in line. It is also the object of this invention to reduce inductance of the via.

The invention satisfies the above objects by providing a non-circular via and a method for cutting away material about a centerline for a non-circular via for PCBs. The method of drilling the non-circular via will be by cutting or removing material away about a centerline with a process such as laser ablation or plasma ablation. This type of cutting away of material about a centerline is sometimes referred to as ablation of material as noted above and allows lateral movements to effect noncircular patterns. This invention utilizes this noncircular approach in three forms, convoluted circle or a square, an extended elongated via up to three times the diameter in depth and a trenched via. The convoluted circle or non-circular via is a Profile Power Micro-via. The Profile via has any shape other than round or circular to create an increased length in circumference over a round or circular format. The Profile via can have a non-circular wave form shape centered on the circumference or pitch circle diameter or an irregular shape that is not based on the round or circular form. A Three Diameter via or a 1–3D via is a through hole having two component dimensions were one is the major dimension of 1–3 length and other minor dimension is its breadth having 1D diameter. Finally, a micro milled trench forming a co-axialised structure is used for noise protection EMI protection and is typically elongated longer than 3 times the diameter of the standard circular Micro-via. The trench may have a length greater than two times the breadth of the trench.

BRIEF DESCRIPTION OF THE DRAWINGS

The advantages of this invention will be better understood by referring to the accompanying drawings, in which.

BEST MODE OF CARRYING OUT THE INVENTION

The inventor has discovered that non-circular vias are feasible for printed circuit boards and are desirable for many reasons. For example a non-circular via can take on an "L" shaped cross section to connect two circuit trace lands or terminal pads on separate circuit board layers while avoiding traces within the region between the legs of the "L" shaped via on layers there between. Other non-circular vias may be used in different ways to adapt to the specific circuit trace layout. It is also desirable to design Vias that are non-circular but are of equivalent overall diameter to comparable standard circular vias because they require less cutting area. This is because, the circumference of a circle is less than some shapes with equivalent overall diameter. The increased circumference makes utilization of non-circular vias beneficial because the increased circumference of no-circular vias increases the current carrying capacity of the via.

In addition it is found that plated through hole methods can be adapted to be utilized to create a perimeter ground plane trench or an outer shield trench, by using a micro milled trench around the perimeter of a PCB or the perimeter surrounding a component or a set of components and can provide an adequate grounding path for ground traces on multiple layers of the PCB and for multiple components positioned at various locations on the PCB or can be utilized for EMI protection. This technique is useful to conform with the available space of densely populated PCBs and uniquely shaped PCBs. The plated trench can extend through several PCB layers and can follow along the board edge regardless of the shape of the board. The trench structure can also encircle a certain area of the printed circuit board for EMI protection of that specific area of the board or a specific component. The trench provides EMI protection because it creates a coaxialised track structure. If a single trench is used it forms a partial outer shield for the coaxialised structure. The partial outer shield of he coaxialised structure comprises the plating of the wall of the trench, the ground plane, and the plating lip that laterally extends from the rim about the opening of the trench. The plating wraps around the rim of the opening of the trench and laterally extends from the opening forming a lip. The coaxialised structure is completed by the circuit trace co-axially extending through the outer shield formed by the trench.

Current grounding schemes may dedicate entire layers to a grounding plane which unnecessarily increases the thickness and weight of the Board and such a grounding layer usually requires isolation on either side by insulation layers. Another method is to utilize a grounding strip or grounding bar bonded between layers of PCBs or Bonded to the edge of a PCB. This requires a much more difficult manufacturing process and the grounding strip is more difficult to make it accessible to all the circuit traces on all of the layers of the PCB.

In summary, alternative shape features will alter the performance of a micro via by increasing it over known shape (round) performance, for example convoluted or square shaped vias. Three ideas form the basis of what is collectively known as Micro Features, for this invention.

These three ideas are categorized as Profile Power Micro via, 1D–3D Vias and the Guard Trench and will now be discussed.

Profile Power Micro via

The basic difference in performance for this alternate micro via, is that it has a greater current carrying capacity than the traditional round or circular micro via of equivalent maximum diametric dimension. As the current carrying capacity of any via is dependent on the circumference wall length and the conducting medium wall thickness, it follows that a larger via (hole) will have a larger or longer circumference than a smaller counterpart. It is therefore the conclusion that the larger circumference (assuming the same conductive medium thickness) will have a greater amount of conducting medium in which to carry current. Profile Power micro vias for the purposes of this patent application are vias that have a circumference or via edge that is longer or larger than can be obtained by using a "round or circular" shape of equivalent maximum diameter in the design, imaging or manufacturing of micro vias. When used for regular interconnect via creation the shape of the via has as its major dimension the equivalent diameter of the normal circular micro via.

When used for a pure "Power configuration" the normal via max dimension need not apply. In this way the vias can be used in all power and interconnect strategies in PCB design and manufacture. The following are a few examples of the usage of the vias in a power interconnect strategy unrestricted by size constraints.

The Profile Power micro via can be any via that has any shape other than round or circular to create the increased length in circumference over equal diameter circular vias. The shape can for example be star, cross, square or any irregular or convoluted shape that increases the length of the circumference over a round or circular format. In principle the Profile Power micro vias are based on a circular format in that they can have a wave form shape centered on the circumference or pitch circle diameter, however the power micro via can be an irregular shape that is not based on the round or circular format. That is, the shape of the micro-via cross section can have an irregular shape that is not based on a round circumferencial maximum diameter or circular form. The micro-via can also be a convoluted stepped square pattern.

Also, the non-circular shape can allow more traces on a given layer to connect to a single via in order to connect to traces on other layers. This is possible due to increased current carrying capacity at a given layer because of the increased circumference thereby increasing the number of possible points of interconnection. In addition noncircular vias allow traces and components to be avoided more readily. Another important feature is removal of the inductance characteristic as seen with the standard circular profile via design by eliminating the coil aspect inherent with circular profile vias. Elimination of inductance results in faster signal performance for high-speed signals because the inductance characteristic of the standard circular profile vias has the tendency to slow down a signal. Also, better noise susceptibility performance results from a non-circular format.

1D–3D Vias

Figure 2:
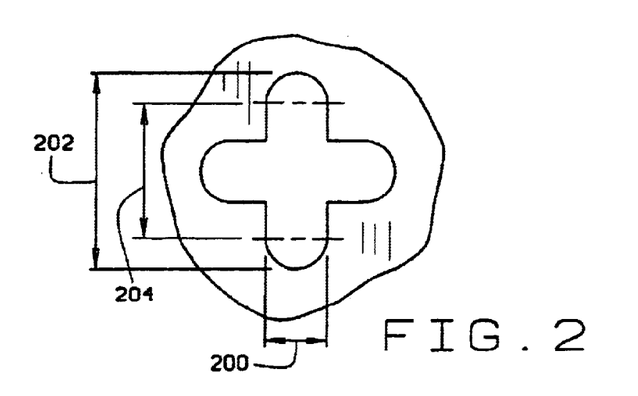
FIG. 2 shows the definition of length and width of a via in a top exterior view using a cross or "+" shaped via.

The 1D–3D via is an alternate form of the power profile micro via. If the standard or normal "round" micro via is considered as a 1D via or a via with a diameter of the ratio 1.0, then the vias mentioned here are all via configurations that use a single diameter as the base dimensioning for a via of two component dimensions. Referring to FIG. 2 one of the dimensions is the length 202 and the other is the breadth or width 200. The length can be in the X or Y orientation or any orientation on a two dimensional plane. The same applies for the breadth. Therefore, a via having a round or circular shape ratio of 1.0:1.0 is to be considered a normal micro via and is not subject to this patent application.

The benefits to the 1D–3D shape via configuration are that it can be directional, using the breadth (the smaller dimension) as the limiting factor for interconnect density. The length is restricted to 3D or three times the length of the breadth for this patent application. Vias with a ratio of greater than 3D are considered as "Trenching" and is described in the next section. Use of the 2D and 3D vias being used in a Manhattan configuration is possible, refer to FIGS. 7 and 8. This enables a via of sufficient size (current carrying capacity) to be placed within a circuit trace track without round pads. Round vias and hence round via pads are limiting factors in interconnect density in PCB design. If we can use this format in design to realize high density interconnect with the same or increased current carrying capacity as normal vias, then an advantage over normal micro via design and manufacture is attained. As a benefit to the manufacture of PCB's the following can be achieved at the photo resist stage. Photo resist requires a certain minimum area of resist to adhere to the copper surface. During the manufacture of micro via PCB's the small vias are imaged using a small area of resist. If we assume that normal micro vias have a ratio of 1.0:1.0, then we can assume that any via of a greater ratio than 1.0 in one of the two dimensions will have a greater area of photo resist to adhere to the copper or other conductive imageable medium, thereby improving yield.

Trenching

The micro milled trenched is a third form for using the micro via concept of having a non-circular or round cross section. Trenching is a slot that is "micro milled" using plasma or laser processing or other method if removing away material about a centerline. This slot is greater in depth than one layer. Trenching is similar to the 1D–3D via formats shown previously. The difference between 1D–3D vias and trenching is length, the vias with a larger ratio than 3.0:1.0 is for this patent called trenching. This does not mean that the two are not interchangeable. There will be instances where the trenching could possibly be smaller than a ratio of 3D, such as the case of a trench having a length greater than two times a breath of the trench, so this must be taken into consideration for this invention. Trenching can be used for EIVIC screening but this technique can be used for all known reference plane or screening techniques that control signal integrity in laminate interconnect solutions. This trenching can be used on the edge of PCB's or within the area of the PCB. Trenching can be used in all PCB or application specific module types, It offers significant signal performance increases, but at a potentially lower layer count and hence lower production costs.

The premise and the details of the various aspects of the invention can be better understood by referring specifically to the drawing. First, referring to FIG. 1, a power profile non-circular cross section micro via 102 can be seen compared to a standard prior art round or circular cross section micro via 104. The maximum or major diameter 100 for the non-circular or "cross" shaped micro via is equivalent to the standard prior art circular via. This is descriptive of a non-circular micro via having a wave form shape centered on the circumference or pitch circle diameter. It can also be seen that the circumference of the "cross" or "+" shaped micro via is longer than the circumference of the standard circular shaped micro via thereby increasing the current carrying capacity of the via as previously explained. Referring to FIG. 2 the cross-shaped micro via is seen again. What is defined as the width 200 and the length 202 of the micro via is shown. The width 200 of the micro via is driven by the breadth of the cutting action of the cutting means and the length 202 of the micro via is driven by the translation distance of the cutting means. The second length 204 defined as the translation distance of the centerline of the cutting means about which it cuts.

Figure 3:
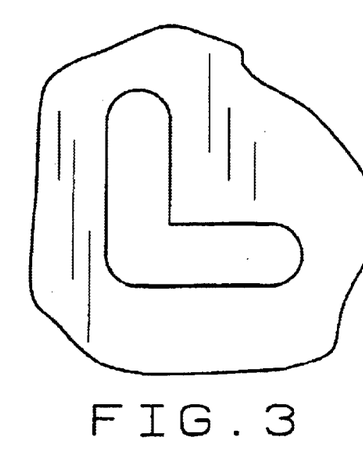
FIG. 3 shows an alternate Profile-1 forming an elbow or "L" shaped via.
Figure 4:
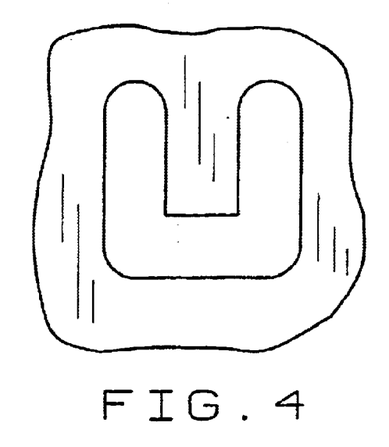
FIG. 4 shows an alternate Profile-2 forming a "U" shaped micro via.
Figure 5:
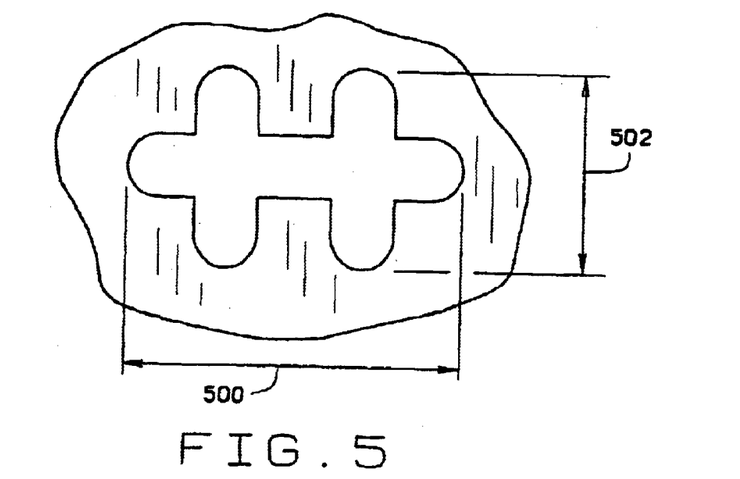
FIG. 5 shows an alternate Profile-3 forming a double cross micro via that is not based on a round circular format or where the shape is not centered on the circumference or pitch of a circle diameter.
Figure 6:
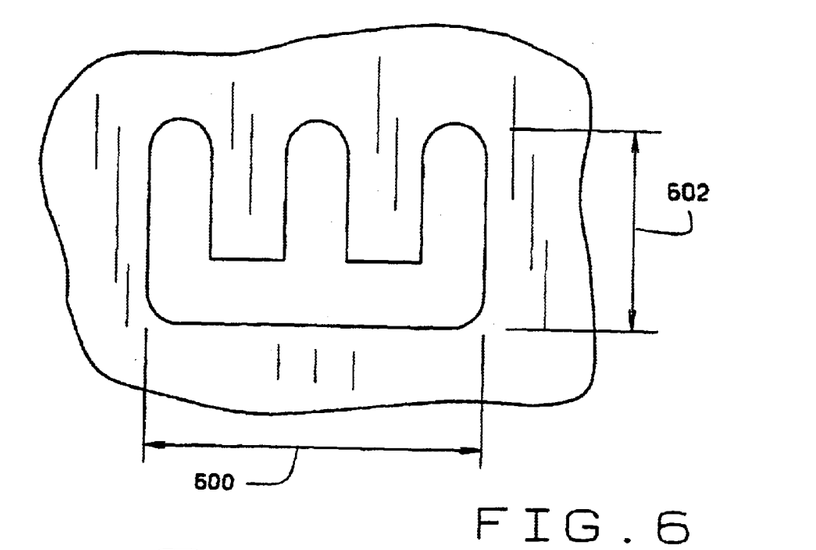
FIG. 6 shows an alternate Profile-4 forming an "E" shaped micro via that is not based on a round circular format or where the shape is not centered on the circumference or pitch of a circle diameter.

Referring to FIGS. 3 and 4, an "L" shaped and a "U" shaped micro via are shown respectively. These alternative cross sections are also based on the round or circular format. However, referring to FIGS. 5 and 6, a "double cross" or "++" and an "E" shaped micro via are shown respectively and they are not based on the round or circular format in that the have a major diameter, 500 and 600 respectively, and a smaller length minor diameter 502 and 602.

Figure 1:
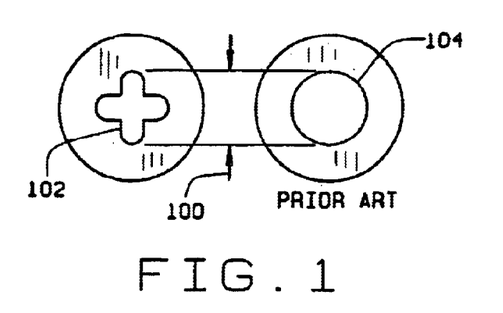
FIG. 1 shows a top view of a typical profile of a power micro-via forming a cross along with a conventional via.
Figure 6A:
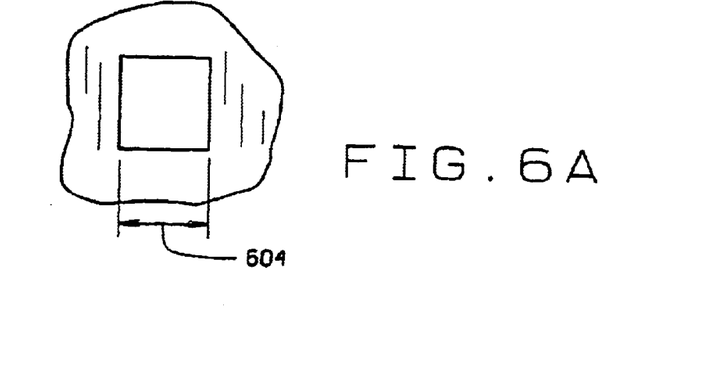

Finally, FIG. 6A shows a square micro via having a breadth 604 equivalent to the diameter of a standard circular profile micro via shown as major diameter 100 in FIG. 1.

Figure 7:
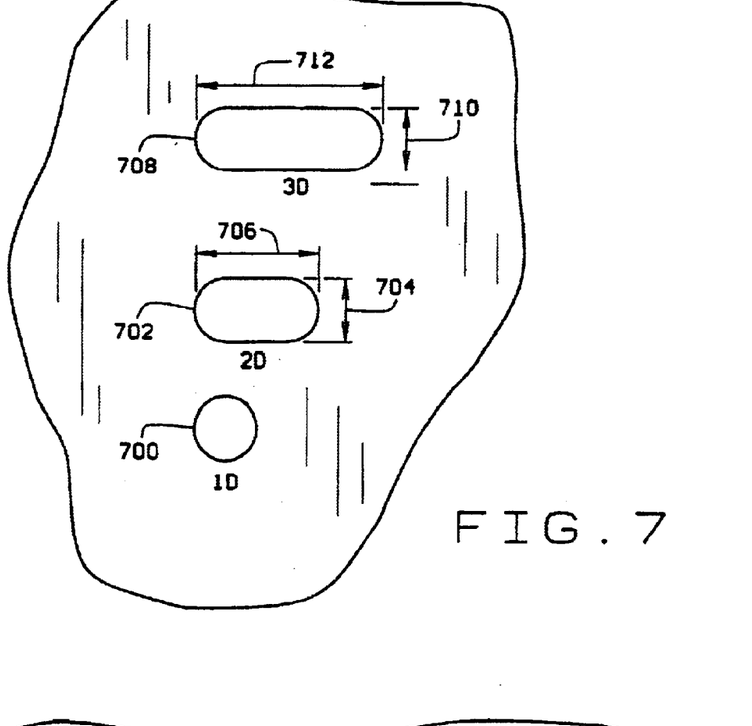
FIG. 7 and FIG. 8 show the Manhattan Interconnect Strategy.

Referring to FIG. 7, the 1D–3D micro via format as discussed earlier is shown. The 1D micro via 700 is representative of a standard micro via having a circular cross section. The 2D micro via 702 has a minor diameter of breadth 704 and a greater length major diameter 706 where the major diameter is two times the diameter of the minor diameter. The 3D micro via 708 has a minor diameter 710 and a greater length major diameter 712 where the major diameter is three times the diameter of the minor diameter. A means of utilizing the 2D–3D micro via format can be seen by referring to FIG. 8 which shows the "Manhattan" (high density or high population) interconnect strategy 800. One of the benefits of 2D–3D shaped via is that it can be directional, using the breadth (the minor diameter) as the limiting factor for interconnect density. Utilizing the 2D–3D via as part of the Manhattan strategy enables a via of sufficient size (circumference or current carrying capacity) to be placed within a higher resolution (more closely spaced) circuit trace pattern without a round terminal pad or interconnect land. Round terminal pads and round vias can limit trace and interconnect density. If the Manhattan configuration is used in design to realize a higher density interconnect with the same or increased current carrying capacity, then an advantage over normal micro via design and manufacturer is attained. A second embodiment 802 of the Manhattan strategy 802 is shown where the circuit trace slightly widens to conform to the form of the via to allow greater current carrying capacity in the via.

Figure 13:
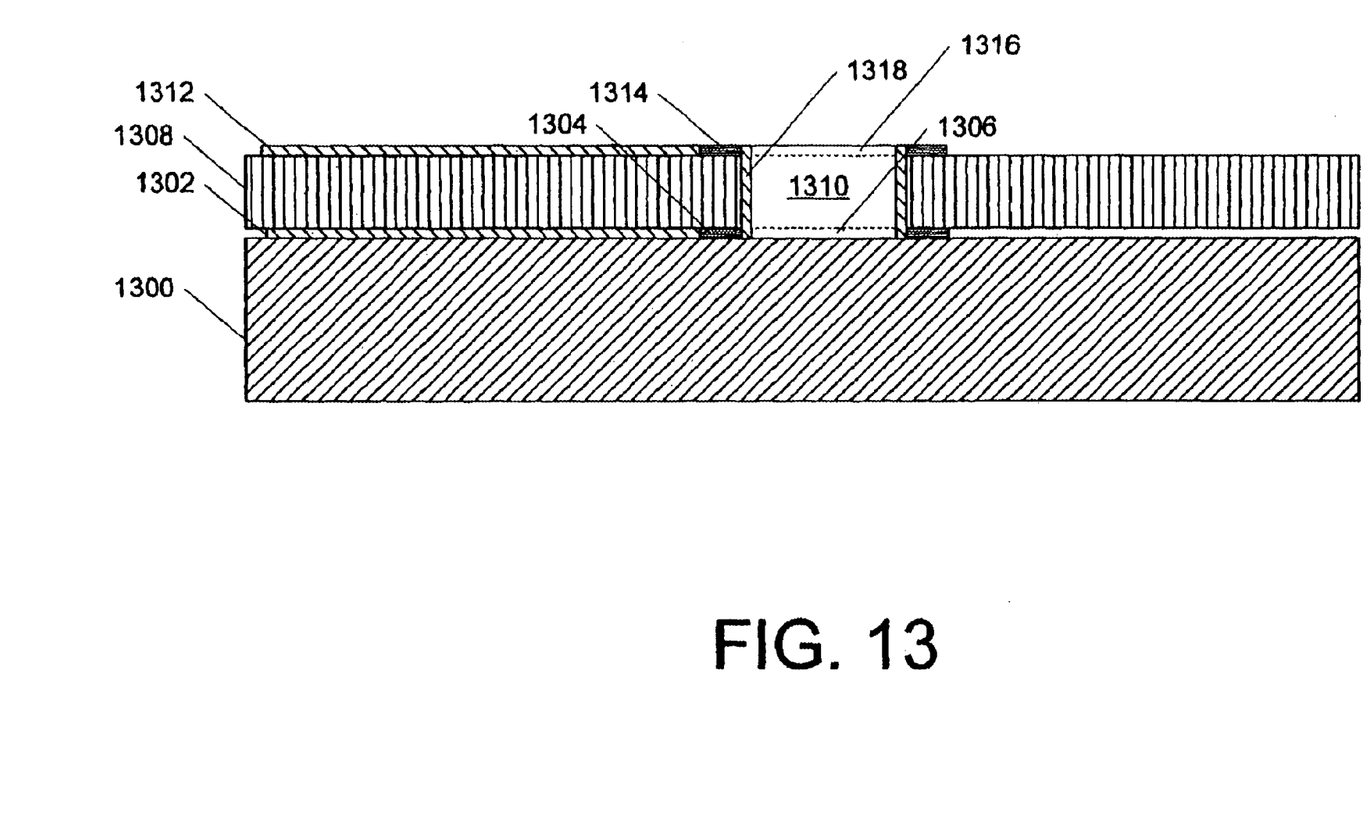
FIG. 13 shows a cross section of a micro via of the present invention.

FIG. 13 illustrates a wiring connection structure using a non-circular micro via in accordance with the present invention for a printed circuit board (PCB). To interconnect a plurality of wiring traces applied on different PCB layers, a first wire trace 1302 is applied to a main surface 1300 of the PCB that has a first terminal landing pad 1304 with a first through hole 1306 there through. The first through hole 1306 has a convoluted shaped cross section with a continuous perimeter. A PCB insulation layer 1308 is formed over the first wire trace 1302 and has a second through hole 1310 of identical cross sectional geometry to and vertically aligned with the first through hole 1306, with the second through hole extending to the first terminal landing pad 1304 to expose a portion of it. A second wire trace 1312 is applied to the PCB insulation layer 1308 and has a second terminal landing pad 1314 with a third through hole 1316 that has identical geometry to and is vertically aligned with the first and second through holes 1306, 1310. The first, second and third through holes 1306, 1310, and 1316 are adjoining and are plated there through with an electrically conductive material to form a plated through hole 1318 with a convoluted cross section that vertically intersects the first and second terminal pads 1304 and 1314 and electrically connects the first wire trace 1302 and the second wire trace 1312 by a connection between the first and second wire trace terminal landing pads 1304 and 1314 and the plated through hole 1318. The through holes have any non-circular shape disclosed in FIGS. 1–7, such as a shaped continuous curved cross section centered on a circumference diameter of a standard single diameter circular profile, wherein the continuous curved cross section can be "U" shaped, "L" shaped, "+" shaped, or can beyond the perimeter defined by the circumference diameter.

Figure 8:
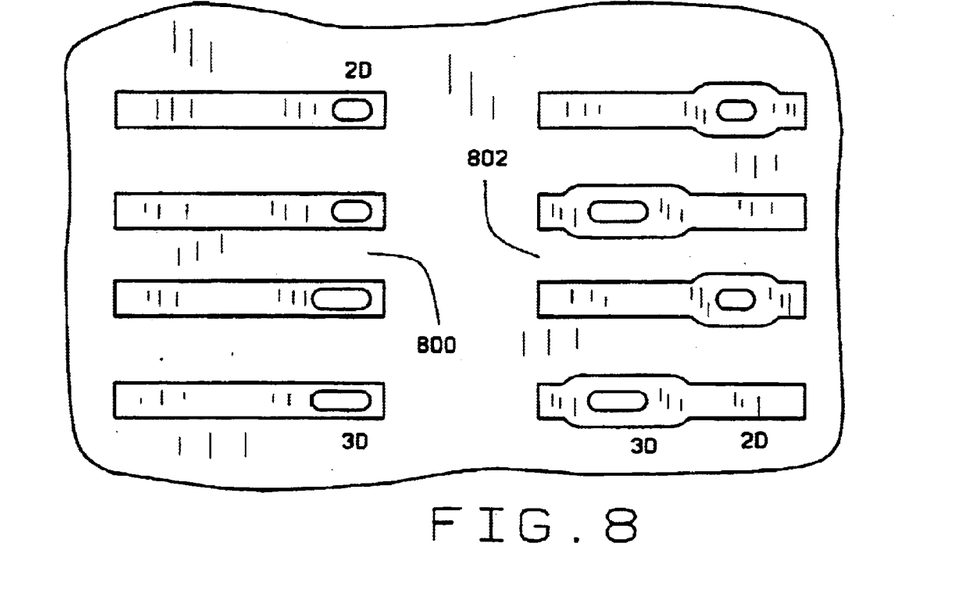

The wiring connection of FIG. 13 is also exemplary of the structure and methods used by the traces, landing pads, and vias illustrated in FIG. 8.

Figure 9:
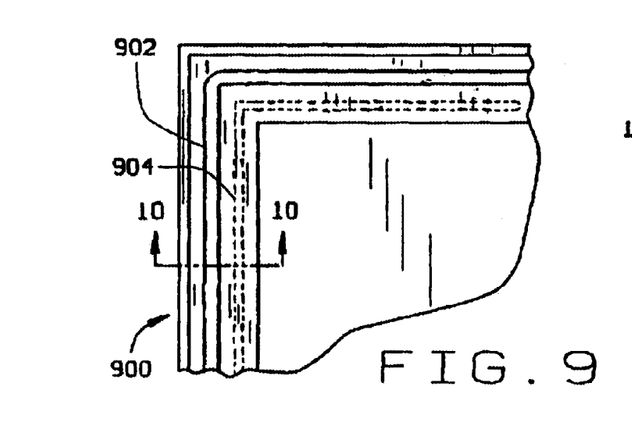
FIG. 9 and FIG. 10 show an alternate guard trench.
Figure 10:
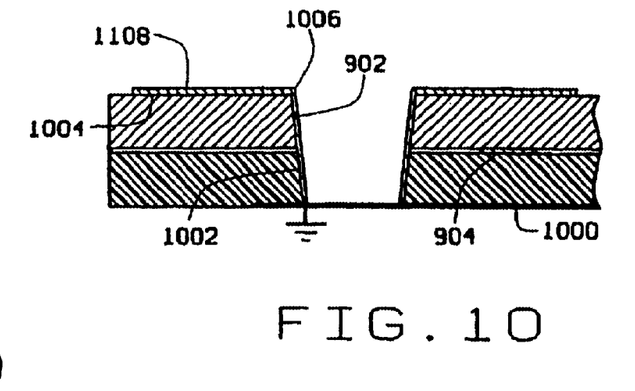
Figure 11:
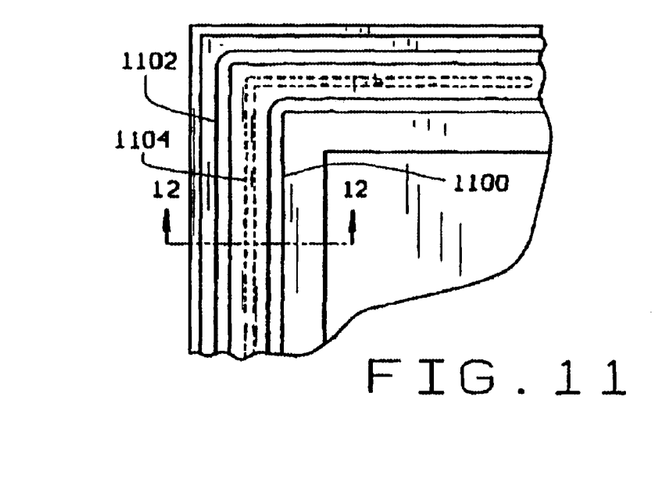
FIG. 11 and FIG. 12 show a double guard trench.

Referring to FIGS. 9–11, a novel guard trenching method is shown. FIG. 9 shows a top view of a corner section of a printed circuit board 900 where a plated trench 902 is shown extended about the perimeter of the board. In this preferred embodiment the trenched via is actually one elongated trenched via aligned along the board edge, however the trench could be a series of aligned trench segments (not shown). Also this example shows an EMC sensitive track 904 (a circuit trace that may be EMI susceptible) that extends inside the perimeter and a partial outer shield defined by the trench and extends in parallel to said trench. The trace 904 is shown as segmented because it is hidden; however, the trace is continuous. This inner EMC sensitive track (EMI sensitive circuit trace) completes a coaxial shielding scheme as well as the possibility of a grounding path established by the plated trench. The plated trench via is created by milling a series of elongated trenched through holes along the desired perimeter that extends to and exposes a grounding plane 1000 (Ref. to FIG. 10). The grounding plane 1000, however could be any reference plane fixed at a given potential level. For the embodiment shown in FIG. 10 the reference plane potential level is fixed at ground. Also note that the ground potential level could be a TTL Logic ground or some other signal ground, chassis ground or some other reference ground. The trench perimeter is preferably a continuous trench. The interior walls 1002 of the elongated through holes and the edges 1004 about the mouth of the holes are then plated with a continuous layer of conductive material 1006 there through thereby providing a path to ground. The structure of the guard trench comprises a micro-milled trench that is plated there through 902. The plating of the trench is continuous along the interior wall 1002 of the trench an extending to the ground plane 1000. The plating wraps around the rim of the opening of the trench and laterally extends from the opening along the edge 1004 about the mouth or opening of the trench forming a lip 1008. The ground plane 1000 and the plating over the interior wall 1002 and the plating lip 1008 form a partial coaxial outer shield about the EMC sensitive inner conductor track 904 thereby creating a coaxial shielding structure.

Figure 12:
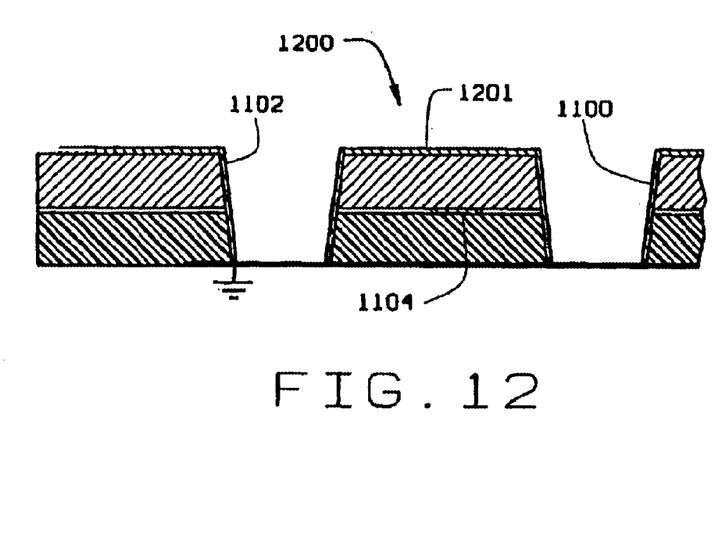

Referring to FIG. 11 and FIG. 12, double guard trenching 1200 with a coaxialised EMC sensitive track is shown. This is a variation of the above-described guard trenching. This embodiment comprises an inner 1100 and outer 1102 trenched via with a coaxialised EMC sensitive track 1104 (circuit trace) there between. The trace is shown as segmented because it is hidden from view; however, the trace is actually continuous. This embodiment can be exactly the same as the single guard trenching described above with the exception of having the inner trench for further shielding and to completely surrounding the EMC sensitive track. The double guard trenching provides a continuous and complete outer shield surrounding the EMC sensitive track because of the joining lip structure 1201 of the double trenches.

What is claimed is:

1. An EMI shielding structure for a printed circuit for shielding a plurality of wire circuit trace layers that are electrically isolated by printed circuit board layers, characterized by:
   a printed circuit board having a plurality of wire trace circuit layers and a plurality of printed circuit board insulation layers there between and having a plurality of printed circuit board edges and a grounding plane; and
   a first trench having an interior wall and extending in parallel with the board edge within a perimeter defined by the board edge encompassing the printed circuit board wire circuit trace and extending through the printed circuit board layers and extending to the ground plane, exposing said ground plane; and
   an electrically conductive plating material applied over the interior wall there through and electrically connecting to the exposed ground plane providing at least a partial perimeter shield for the printed circuit board and an EMC sensitive track of conductive material extending wholly within and parallel with an outer perimeter defined by a first elongated through hole and disposed between circuit board insulation layers through with the trenched through hole extends.

2. The EMI shielding structure of claim 1, where the perimeter encompasses a portion of the printed circuit board.

3. The EMI shielding structure of claim 1, further characterized by:
   a second trench having an interior wall and extending wholly within and in parallel with an outer perimeter defined by the first trench and extending through the printed circuit board layers and extending to the ground plane exposing said ground plane,
      wherein the second trench interior wall is plated with an electrically conductive plating material applied over the interior wall there through and electrically connecting to the exposed ground plane providing a double trench shield.

4. An EMI shielding structure for a printed circuit for shielding a plurality of wire trace layers that are electrically isolated by printed circuit board layers characterized by:
   a printed circuit board having a plurality of wire trace circuit layers and a plurality of printed circuit board insulation layers there between and having a grounding plane layer with all layers bonded one over another;
   a first trench with an continuous rim about an opening of the trench at a top layer of the printed circuit board and said trench having an interior wall and said trench extending around a perimeter of the printed circuit board;
   an electrically conductive plating applied over the interior wall of the trench extending and electrically connecting to the ground plane and extending to an wrapping over the rim and extending laterally from said rim forming a lip; and
   an EMC sensitive track coaxially extending through a partial outer shield defined by the trench interior wall, the plating lip and the ground plane.

5. The EMI shielding structure of claim 4, further characterized by:
   a second trench with an continuous rim about an opening of the trench at a top layer of the printed circuit board and said trench having an interior wall and said trench extending in parallel with the first trench around a perimeter within the first trench; and
   an electrically conductive plating applied over the interior wall of the trench extending and electrically connecting to the ground plane and extending to an wrapping over the rim and extending laterally from said rim forming a second lip which joins the first lip,
      where the EMC sensitive track coaxially extends through an outer shield defined by the first and second trench interior walls, the first and second plating lips and the ground plane.

* * * * *

UNITED STATES PATENT AND TRADEMARK OFFICE
CERTIFICATE OF CORRECTION

| | |
|---|---|
| PATENT NO. | : 6,713,685 B1 |
| APPLICATION NO. | : 09/786787 |
| DATED | : March 30, 2004 |
| INVENTOR(S) | : Martin A. Cotton |

It is certified that error appears in the above-identified patent and that said Letters Patent is hereby corrected as shown below:

On the Title page (56), under "References Cited U.S. Patent Documents": Insert the following references:

5,414,222 A * 5/1995 Sen et al. ...................... 174/262
5,522,132 A * 6/1996 Mattei ........................ 29/846
5,734,560 A * 3/1998 Kamperman et al. ........... 361/774

Signed and Sealed this

Tenth Day of October, 2006

JON W. DUDAS
*Director of the United States Patent and Trademark Office*